United States Patent [19]
Proulx

[11] Patent Number: 5,901,155
[45] Date of Patent: *May 4, 1999

[54] SYSTEM AND METHOD FOR TESTING THE OPERATION OF REGISTERS IN ELECTRONIC DIGITAL SYSTEMS

[75] Inventor: Richard A. Proulx, Lexington, Mass.

[73] Assignee: Sun Microsystems, Inc., Palo Alto, Calif.

[*] Notice: This patent is subject to a terminal disclaimer.

[21] Appl. No.: 08/925,407

[22] Filed: Sep. 8, 1997

Related U.S. Application Data

[62] Division of application No. 08/593,582, Jan. 30, 1996, Pat. No. 5,666,368.

[51] Int. Cl.⁶ .......................... G01R 31/28; G11C 29/00
[52] U.S. Cl. .......................... 371/27.1; 371/21.2; 371/21.3
[58] Field of Search ................. 371/27.1, 21.2, 371/21.3, 21.1, 22.1, 22.2, 22.5, 22.6, 24, 25.1, 26, 67.1, 70; 365/201

[56] References Cited

U.S. PATENT DOCUMENTS

| | | | |
|---|---|---|---|
| 4,369,511 | 1/1983 | Kimura et al. | 371/27.1 |
| 4,760,575 | 7/1988 | Watanabe | 371/25 |
| 4,783,785 | 11/1988 | Hanta | 371/25 |
| 4,821,238 | 4/1989 | Tatemastsu | 365/201 |
| 5,185,744 | 2/1993 | Arimoto et al. | 371/21.3 |
| 5,231,605 | 7/1993 | Lee | 371/21.2 |

*Primary Examiner*—Hoa T. Nguyen
*Attorney, Agent, or Firm*—Richard A. Jordan

[57] ABSTRACT

A new register test system and method is provided for testing a register. The register under test has a number of bit storage locations, each of which is associated with one of a plurality of categories, including, for example, a read/write category, a read-only category, a write-only category, an always-"1" category and an always-"0" category. In accordance with the method, in each of a plurality of iterations, a data word is generated, stored it in the register under test, and thereafter retrieved from the register. For each iteration, an expected pattern is generated for comparison to the retrieved contents, using the original data, the retrieved contents and a plurality of mask patterns each associated with one of the categories. The expected pattern is compared to the pattern of the contents retrieved from the register and whether the register is deemed to be operating properly can be determined by whether the expected pattern corresponds to the retrieved pattern. The pattern of data words generated for testing of the register during the successive iterations may be related to the particular categories for the respective storage locations, which can reduce the number of patterns which may be required to exhaustively test the register. A system for performing the method may be can be constructed in whole or in part from special purpose hardware or a general purpose computer system, or any combination thereof, any portion of which may be controlled by a suitable program.

60 Claims, 3 Drawing Sheets

FIG.1

FIG. 2A ns, each of
SYSTEM AND METHOD FOR TESTING THE OPERATION OF REGISTERS IN ELECTRONIC DIGITAL SYSTEMS This application is a division of application Ser. No. 08/593,582 filed Jan. 30, 1996, now U.S. Pat. No. 5,666,368.

FIELD OF THE INVENTION

The invention relates generally to the field of systems and methods for testing the operation of digital electronic systems to verify that they are operating properly. More specifically, the invention relates to systems and methods for testing registers that are used in such systems to verify that they are operating properly.

BACKGROUND OF THE INVENTION

Digital electronic systems, such as digital computer systems and the like, are often tested by providing inputs such as particular sets of signals, programs, and the like, and determining whether particular circuit elements are generating sets of outputs which would be expected in response to the particular sets of inputs. If the outputs of the circuit elements are as would be expected based on the inputs that are provided during a testing operation, the circuit elements are deemed to be operating properly, at least within the testing capabilities of the testing procedures and sets of inputs that are provided during the testing operation. On the other hand, if the outputs of the circuit elements are not as would be expected based on the inputs that are provided during a testing operation, the outputs that are generated can provide valuable information which may be used to diagnose malfunctions in the digital electronic system under test.

One problem arises in testing of digital electronic system, in particular relating to the number of inputs that may be required to exhaustively test the digital electronic system's circuit elements. One particularly difficult type of circuit element to exhaustively test is a register. Registers are typically used in a digital electronic system to store control information, which may be used to control various other elements of the digital electronic system, status information which indicates status of operations of various elements of the digital electronic system, and other types of information. Information is stored in a register in the form of a data word, having a number of bits, and to test a register a data word having a particular bit pattern may be stored in the register, the contents of the register retrieved, and the bit pattern of the retrieved contents compared to an expected bit pattern. In conventional testing arrangements, to exhaustively test a register, typically data words having all possible bit patterns should be used in connection with the register. However, for a register which stores data words which have more than a relatively small number of bits, the number of bit patterns which may be stored in the register may be prohibitively large. For example, for a register which stores data words having as few as thirty-two bits, data words having $2^{32}$ (over four billion) bit patterns may be stored in such a register. For such registers, conventional testing arrangements typically will use only a subset of the possible data words, which may be insufficient to exhaustively test the register.

SUMMARY OF THE INVENTION

The invention provides a new and improved system and method for testing the operation of registers in a digital electronic system.

In brief summary, the invention provides a new register test system and method for testing a register. The register under test has a number of bit storage locations, each of which is associated with one of a plurality of categories. In one embodiment, the categories are selected to include, for example, a read/write category, a read-only category, a write-only category, an always-"1" category and an always-"0" category. To test the register, the register test system, in a plurality of iterations, generates a data word, stores it in the register under test, and retrieves the contents of the register. After the contents of the register have been retrieved for each iteration, the register test system will generates an expected pattern for comparison to the retrieved contents, using the original data (that is, the data word generated for storage in the register), the retrieved contents and a plurality of mask patterns each associated with one of the categories, and compare the expected pattern to the pattern of the contents retrieved from the register. If the expected pattern corresponds to the retrieved pattern, the register may be deemed to be operating properly in connection with the pattern of the data word that was stored in the register during the iteration. On the other hand, if the expected pattern does not correspond to the retrieved pattern, the register may be deemed not to be operating properly in connection with the pattern of the data word that was stored in the register during the iteration. The pattern of data words generated for testing of the register during the successive iterations may be related to the particular categories for the respective storage locations, which can reduce the number of patterns which may be required to exhaustively test the register.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
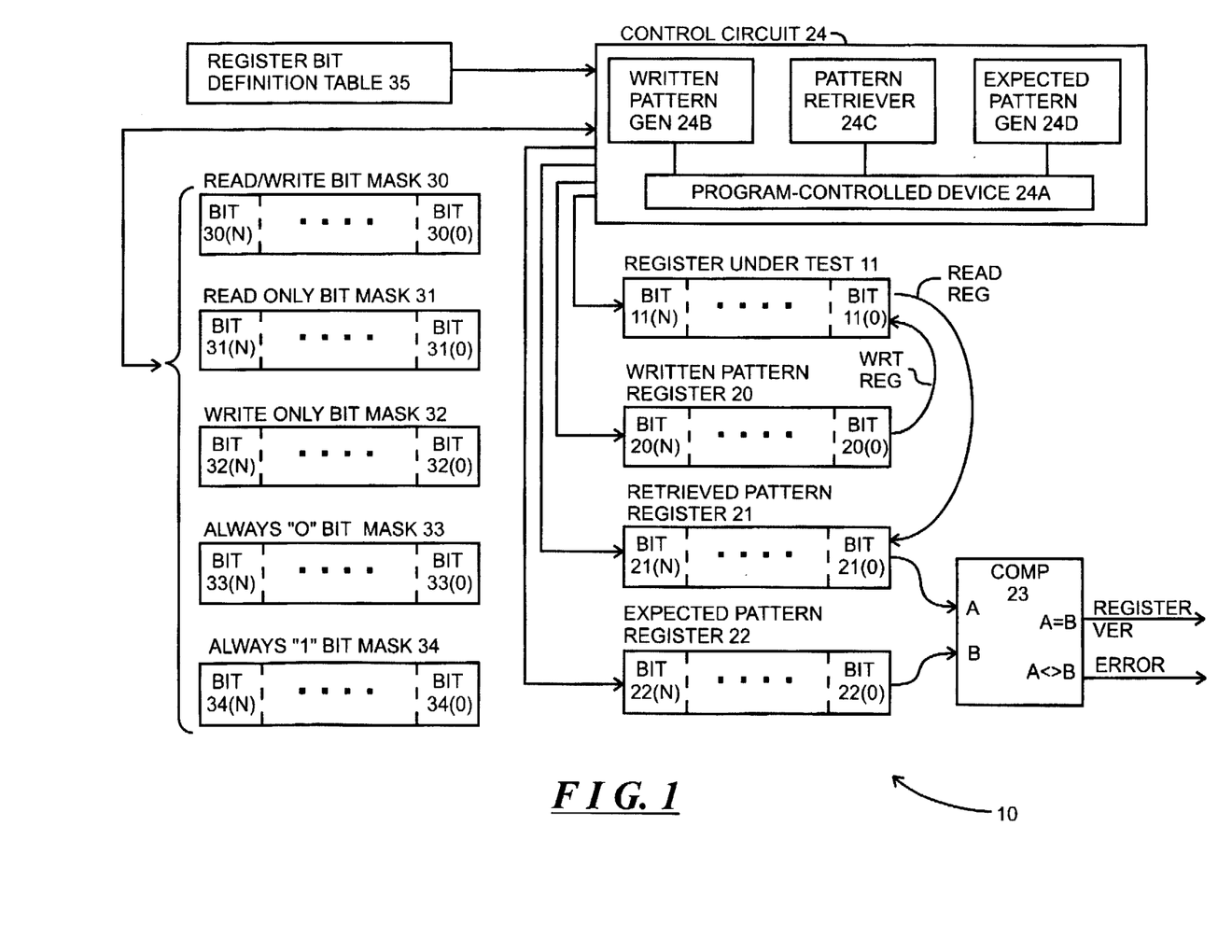
FIG. 1 is a functional block diagram depicting a system for testing the operation of an information storage register which may be used in connection with a digital electronic systems and devices, which will be useful in understanding the invention.

FIG. 1 is a functional block diagram depicting a register test system 10 for testing the operation of a register 11. The register 11 under test may comprise any of a number of information storage, control, status or other types of registers which may be used in connection with a digital electronic system. A digital electronic system which contains register 11 will typically include digital circuitry which makes use of information stored in register 11, and may also store information in register 11.

The register test system 10 tests the register 11 to verify that it is operating properly. In that operation, the register test system 10 will store data in the register 11, retrieve the contents of the register 11 and compare the retrieved contents to contents that are expected to determine whether the contents that are retrieved correspond to the expected contents. If the contents of the register 11, as actually retrieved from the register 11, correspond to the expected contents, the register test system 10 may deem the register 11 to be operating properly. On the other hand, if the contents of the register 11, as actually retrieved therefrom, do not correspond to the expected contents, the register test system 10 may deem the register 11 not to be operating properly. The register test system 10 may perform these operations in a number of iterations during, for example, a diagnostic or maintenance session in connection with the digital electronic system to test the operations of the register 11, during the various iterations using data words having a variety of data patterns to verify that the register 11 operates properly with respect to a variety of data patterns. The register test system 10 may also store test results for all or a subset of the data patterns used during the session, and in particular may store the test results for data patterns, (if any) for which the register 11 was deemed not to be operating properly.

As shown in FIG. 1, the register test system 10 includes a number of elements, including a written pattern register 20, a retrieved pattern register 21, an expected pattern register 22 and a comparator 23, all under control of a control circuit 24. The written pattern register 20 stores a digital data word generated by the control circuit 24 that, under control of the control circuit 24, will be written into the register 11 under test. The control circuit 24 will also enable a retrieval operation to be performed in connection with the register 11 to facilitate retrieval of the contents of the register 11 and storage of the retrieved contents to be stored in the retrieved pattern register 21. The control circuit 24, using the data word to be written into the register 11 (which corresponds to the data word stored in the written pattern register 20), the retrieved contents of register 11 as stored in the retrieved pattern register 21, and a number of mask patterns as stored in a set of mask registers 30 through 34, generates an expected data word for storage in the expected pattern register 22. After generating the expected data word and storing it in the expected pattern register 22, the control circuit 24 enables the comparator 23 to compare the contents of the retrieved pattern register 21 and the expected pattern register 22. If the comparator 23 determines that the contents of the retrieved pattern register 21 correspond to the expected pattern register 22, it generates a REGISTER VER register verified indication, indicating that the register 11 under test is operating properly. On the other hand, if the comparator 23 determines that the contents of the retrieved pattern register 21 do not correspond to the expected pattern register 22, it generates an ERROR indication, indicating that the register 11 under test is not operating properly. The control circuit 24 may use the indications from the comparator 23 to control its subsequent operations, such as, for example, in controlling storage of test results. The control circuit 24 may enable these operations to be performed through in a number of iterations, during the various iterations using data words having a variety of data patterns to test the operation of the register 11 with respect to a variety of data words.

As is conventional, each of the registers, including the register 11 under test, the written pattern register 20, retrieved pattern register 21 and expected pattern register 22 comprise a series of bit storage locations, each of which stores a particular bit of the data word (in the case of the register 11 under test), or a particular bit of the written, retrieved and expected patterns stored in respective registers 20 through 22. In particular, the register 11 under test includes a number of tested register bit storage locations 11(0) through 11(N) (generally identified by reference numeral 11(n)), each of which stores a bit of the data word stored in the register 11. The written pattern register 20 includes a number of written pattern bit storage locations 20(0) through 20(N) (generally identified by reference numeral 20(n)) each of which stores a bit of the data word to be written in the register 11 under test. In the storage operation, the bit from each written pattern bit storage location $20(n_w)$ will be written into the correspondingly-indexed tested register bit storage location $11(n_w)$ (for each value of index "$n_w$" from 0 to N) of the register under test. That is, the bit from written pattern bit storage location 20(0) will be written into tested register bit storage location 11(0), the bit from written pattern bit storage location 20(1) will be written into tested register bit storage location 11(1), and so on.

Similarly, the retrieved pattern register 21 includes a number of retrieved pattern bit storage locations 21(0) through 21(N) (generally identified by reference numeral 21(n)), each of which stores a bit of the data word that is retrieved from the register 11 under test. In the retrieval operation, the bit from a tested register bit storage location $11(n_r)$ will be stored in the correspondingly indexed retrieved pattern bit storage location $21(n_r)$, so that the bit from tested register bit storage location 11(0) will be stored in retrieved pattern bit storage location 21(0), the bit from tested register bit storage location 11(1) will be stored in retrieved pattern bit storage location 21(1), and so on.

Finally, the expected pattern register also includes a number of expected pattern bit storage locations 22(0) through 22(N) (generally identified by reference numeral 22(n)), each of which stores a bit of the data word that is expected to be retrieved from the register 11 under test. In the compare operation, performed by the comparator 23, the bit from each retrieved pattern bit storage location $21(n_c)$ will be bit-wise compared with the correspondingly-indexed expected pattern bit storage location $22(n_c)$, so that the bit from retrieved pattern bit storage location 21(0) will be compared with expected pattern bit storage location 22(0), the bit from retrieved pattern bit storage location 21(1) will be compared with expected pattern bit storage location 22(1), and so on. If the comparator 23 determines that, for each value of index "n" from "0" to "N," the bit in retrieved pattern bit storage location 21(n) corresponds to the bit in expected pattern bit storage location 22(n), it will generate the REGISTER VER register verified indication. On the other hand, if the comparator 23 determines that, for any "n" from "0" to "N," the bit in retrieved pattern bit storage location 21(n) does not correspond to the bit in expected pattern bit storage location 22(n), it will generate the ERROR indication, indicating erroneous operation by the register 11 under test.

In one embodiment, the control circuit 24 includes a program-controlled device 24A, a written pattern generation control module 24B, a pattern retriever control module 24C and an expected pattern generation control module 24D. The written pattern generation control module 24B enables the program-controlled device 24A to generate the data word for storage in the written pattern register 20 and write the data word so generated in the register 11 under test. The pattern retriever control module 24C enables the program-controlled device to, in turn, enable the contents of the register 11 under test to be retrieved and stored in the retrieved pattern register 21. The expected pattern generation control module 24D enables the program-controlled device to generate the expected pattern for storage in the expected pattern register 22.

As described above, and in accordance with the invention, the control circuit 24 uses a set of bit masks in mask registers 30 through 34 in generating the expected data word for storage in the expected pattern register 22. In one particular embodiment, the control circuit 24 categorizes each of the various tested register bit storage locations 11(n) of the register 11 under test into one of five categories, including a read/write category, a read-only category, a write-only category, an always-"0" category and an always-"1" category. The categories generally assist in generation of the expected data word. In addition, the categories may be used in connection with strategies implemented by the control circuit 24 to generate data words for storage in the register 11 under test in the various iterations as will be described below. By using the various data word generation strategies in relation to the various categories, the number of data words which may be required to substantially exhaustively test register 11 may be significantly reduced from the number which may otherwise be required, which, in turn, may reduce the amount of time required to test the register 11 under test.

As indicated above, the control circuit 24 categorizes each location 11(n) into a read/write category, a read-only category, a write-only category, an always-"0" category or an always-"1" category. A tested register bit storage location $11(_{r/w})$ which is in the read/write category can be both written and retrieved. That is, for such a storage location $11(n_{r/w})$, if the contents of the register 11 are retrieved immediately after a storage operation (that is, if the contents are retrieved before other circuitry in the digital electronic system which maintains the register 11 under test modifies the contents of the register 11), the value of tested register bit storage location $11(n_{r/w})$ as retrieved will correspond to the value as stored therein during the storage operation.

On the other hand, a tested register bit storage location $11(n_{ro})$ which is in the read-only category can be retrieved, but not written; the value of the bit in the location $11(n_{ro})$ may, for example, represent status of a digital electronic system which includes the register 11 under test. The value of a storage location $11(n_{ro})$ in the read-only category is generally controlled by other circuitry comprising the digital electronic system which includes the register 11 under test, and so if the control circuit 24 attempts to store a value into the location $11(n_{ro})$, the value will have no effect on the contents of the location $11(n_{ro})$. Accordingly, for such a storage location $11(n_{ro})$, if the control circuit 24 enables contents of the register 11 to be retrieved immediately after a storage operation, the value of storage location $11(n_{ro})$ as retrieved may have any value which the location $11(n_{ro})$ may have, independent of the value that is written into the storage location $11(n_{ro})$ during the storage operation. Contrariwise, a tested register bit storage location $11(n_{wo})$ which is in the write-only category can be written, so that effectively the value of the bit in the location $11(n_{wo})$ can affect the digital system which includes the register 11 under test, but when the register 11 is retrieved the contents of the location $11(n_{wo})$, will be undefined. For such a storage location, if the contents of the register 11 are retrieved immediately after they are written, the value of tested register bit storage location $11(n_{wo})$ as retrieved may also have any value which the location may have, independent of the value that is stored in the storage location $11(n_{wo})$.

Finally, a tested register bit storage location $11(n_1)$ or $11(n_0)$ which is in the always-"1" or always-"0" category, respectively, will, when the contents of the register 11 are retrieved, provide the value "one" or "zero," respectively, independent of the value that is stored in the storage location $11(n_1)$ or $11(n_0)$.

Each of the mask registers 30 through 34 is associated with one of the five categories described above, and is used in generating the expected data word for storage in expected pattern register 22. Each of the mask registers 30 through 34 includes a mask that corresponds to the pattern of storage locations 11(n) in the register 11 under test which belong to the category associated with the associated mask register 30 through 34. In particular, read/write mask register 30 includes a number of read/write bit mask storage locations 30(0) through 30(N) (generally identified by reference numeral 30(n)). Each read/write bit mask storage location 30(n) is associated with a correspondingly-indexed tested register bit storage location 11(n). If a tested register bit storage location 11(n) is in the read/write category, the correspondingly-indexed read/write bit mask storage location 30(n) will be set. On the other hand, if a tested register bit storage location 11(n) is not in the read/write category, the correspondingly-indexed read/write bit mask storage location 30(n) will be clear.

Similarly, read-only mask register 31 includes a number of read-only bit mask storage locations 31(0) through 31(N) (generally identified by reference numeral 31(n)). Each read-only bit mask storage location 31(n) is associated with a correspondingly-indexed tested register bit storage location 11(n). If a tested register bit storage location 11(n) is in the read-only category, the correspondingly-indexed read-only bit mask storage location 31(n) will be set. On the other hand, if a tested register bit storage location 11(n) is not in the read-only category, the correspondingly-indexed read-only bit mask storage location 31(n) will be clear.

In addition, write-only mask register 32 includes a number of read-only bit mask storage locations 32(0) through 32(N) (generally identified by reference numeral 31(n)). Each write-only bit mask storage location 32(n) is associated with a correspondingly-indexed tested register bit storage location 11(n). If a tested register bit storage location 11(n) is in the write-only category, the correspondingly-indexed write-only bit mask storage location 32(n) will be set. On the other hand, if a tested register bit storage location 11(n) is not in the write-only category, the correspondingly-indexed write-only bit mask storage location 32(n) will be clear.

The always-"0" mask register 33 includes a number of always-"0" bit mask storage locations 33(1) through 33(N) (generally identified by reference numeral 33(n)). Each always-"0" bit mask storage location 33(n) is associated with a correspondingly-indexed tested register bit storage location 11(n). If a tested register bit storage location 11(n) is in the always-"0" category, the correspondingly-indexed always-"0" bit mask storage location 33(n) will be set. On the other hand, if a tested register bit storage location 11(n) is not in the always-"0" category, the correspondingly-indexed always-"0" bit mask storage location 33(n) will be clear.

Finally, the always-"1" mask register 33 includes a number of always-"1" bit mask storage locations 34(1) through 34(N) (generally identified by reference numeral 34(n)). Each always-"1" bit mask storage location 34(n) is associated with a correspondingly-indexed tested register bit storage location 11(n). If a tested register bit storage location 11(n) is in the always-"1" category, the correspondingly-indexed always-"1" bit mask storage location 34(n) will be set. On the other hand, if a tested register bit storage location 11(n) is not in the always-"1" category, the correspondingly-indexed always-"1" bit mask storage location 34(n) will be clear.

It will be appreciated that each tested register bit storage location 11(n) in the register 11 under test will normally be in only one of the five categories described above. Accordingly, for each value of index "n," the mask storage location 30(n) through 34(n) in only one mask register 30 through 34 will be set, and correspondingly-indexed mask storage locations in the other mask registers will be clear.

The contents of the mask registers 30 through 34 may be pre-defined for the control circuit 24 for a particular register 11 under test, or they may be generated by the control circuit 24 from a register bit definition table 35, which will identify the category associated with each tested register bit storage location 11(n) for the register 11 under test.

As noted above, the control circuit 24 uses the mask registers 30 through 34 along with the contents of the written pattern register 20 and retrieved pattern register 21 in generating the expected data word for storage in the expected pattern register 22. The particular operations used by the control circuit 24 in generating a value for storage in each of the expected pattern bit storage locations 22(n) will depend upon the mask register 30 through 34 whose correspondingly-indexed mask storage location 30(n) through 34(n) is set. That is, if for an index "n" the read/write mask storage location 30(n) is set, indicating that the tested register bit storage location 11(n) of the register 11 under test is in the read/write category, if the register 11 is operating properly the value to be retrieved from the location 11(n) corresponds to the value that is stored in the location 11(n) during the storage operation; in that case, the control circuit 24 will generate a value for the expected pattern mask storage location 22(n) which corresponds to the value in the written pattern bit storage location 20(n).

On the other hand, if for an index "n" the read-only mask storage location 31(n) is set, indicating that the tested register bit storage location 11(n) of the register 11 under test is in the read-it only category, if the register 11 is operating properly the value to be retrieved from the location 11(n) corresponds to the value that is retrieved from the location 11(n) during the retrieval operation; in that case, the control circuit 24 will generate a value for the expected pattern mask storage location 22(n) which corresponds to the value in the retrieved pattern bit storage location 21(n). Similarly, if for an index "n" the write-only mask storage location 32(n) is set, indicating that the tested register bit storage location 11(n) of the register 11 under test is in the write-only category, if the register 11 is operating properly the value to be retrieved from the location 11(n) also corresponds to the value that is retrieved from the location 11(n) during the retrieval operation; in that case, the control circuit 24 will also generate a value for the expected pattern mask storage location 22(n) which corresponds to the value in the retrieved pattern bit storage location 21(n).

Similarly, if for an index "n" the always-"0" mask storage location 33(n) is set, indicating that the tested register bit storage location 11(n) of the register 11 under test is in the always-"0" category, if the register 11 is operating properly the value to be retrieved from the location 11(n) corresponds to the value "zero;" in that case, the control circuit 24 will generate a value for the expected pattern mask storage location 22(n) which corresponds to the value "zero." In addition, if for an index "n" the always-"1" mask storage location 34(n) is set, indicating that the tested register bit storage location 11(n) of the register 11 under test is in the always-"1" category, if the register 11 is operating properly the value to be retrieved from the location 11(n) corresponds to the value "one"; in that case, the control circuit 24 will also generate a value for the expected pattern mask storage location 22(n) which corresponds to the value "one."

Otherwise stated, in summary, since, for each value of index "n," mask storage location 30(n) through 34(n) of only one mask register 30 through 34 will be set, the control circuit 24 will generate a value ExPatReg(n) for each expected pattern bit storage location 22(n) as $$ExPatReg(n) = [WrPatReg(n) \wedge R/WMask(n)]$$
$$\vee [RdPatReg(n) \wedge ROMask(n)]$$
$$\vee [RdPatReg(n) \wedge WOMask(n)]$$
$$\vee [\overline{A1-0Mask(n)} \wedge A1-0Mask(n)]$$
$$\vee [A1-1Mask(n)]$$

where $\wedge$ represents the logical "AND" operation, $\vee$ represents the logical "OR" operation, "WrPatReg(n)" represents the value of written pattern bit storage location 20(n)

"RdPatReg(n)" represents the value of retrieved pattern bit storage location 21(n)

"W/RMask(n)" represents the value of read/write mask storage location 30(n)

"ROMask(n)" represents the value of read-only mask storage location 31(n)

"WOMask(n)" represents the value of the write-only mask storage location 32(n)

"A1-0Mask(n)" represents the value of the always-"0" mask storage location 33(n); and "A1-1Mask(n)" represents the value of the always-"1" mask storage location 34(n).

and the overline bar indicates the complementary value. It will be appreciated that (i) the first term, namely, "WrPatReg(n)$\wedge$R/WMask(n)" corresponds to the value generated if the storage location 11(n) of the register 11 under test is of the read/write category;

(ii) the second term, namely, "RdPatReg(n)$\wedge$ROMask (n)," corresponds to the value generated if the storage location 11(n) of the register 11 under test is of the read-only category;

(iii) the third term, namely, "RdPatReg(n)$\wedge$WOMask(n)" corresponds to the value generated if the storage location 11(n) of the register 11 under test is of the write-only category;

(iv) the fourth term, namely, "$\overline{A1-0Mask(n)}\wedge$A1-0Mark (n)," corresponds to the value generated if the storage location 11(n) of the register 11 under test is of the always-"0" category (it will be appreciated that the term actually corresponds to the value "zero" for each storage location), and (v) the fifth term, namely, "A1-1Mask(n)," corresponds to the value generated if the storage location 11(n) of the register 11 under test is of the always-"1" category.

It will be appreciated that storage locations 11(n) of the always-"0" category will normally always be clear (representing the value "zero") and so the control circuit 24, instead of generating the values for the expected value bit storage locations 22(n) corresponding to tested register bit storage locations 11(n) of the always-"0" category (reference the fourth term (iv) described above), may merely initialize all of the expected pattern bit storage locations 22(n) of the expected pattern register 22 to the clear condition and thereafter condition the bit storage locations 11(n) of the other categories.

Figure 2A:
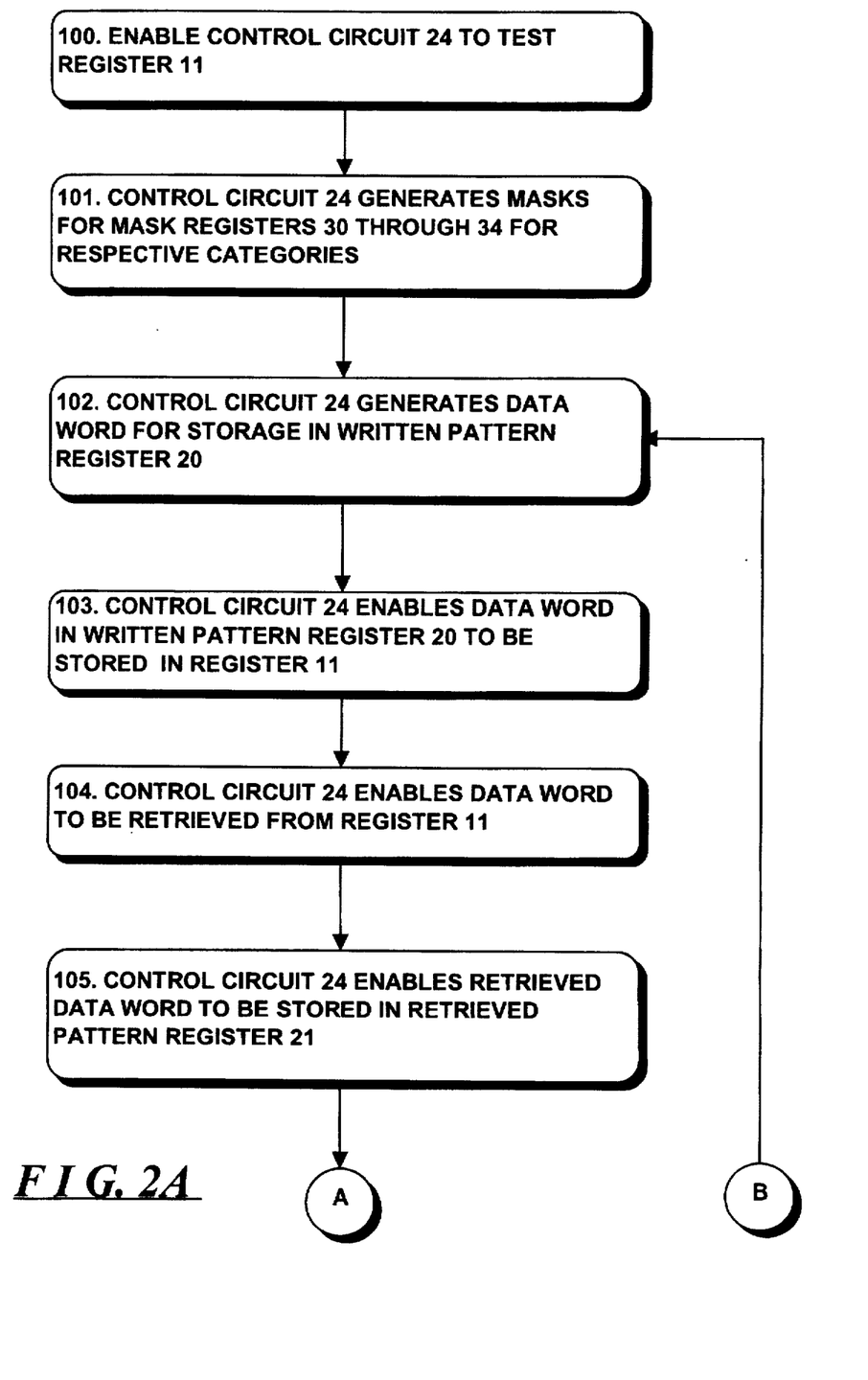
FIG. 2 is a flow diagram depicting the operations performed by the system in connection with the invention.
Figure 2B:
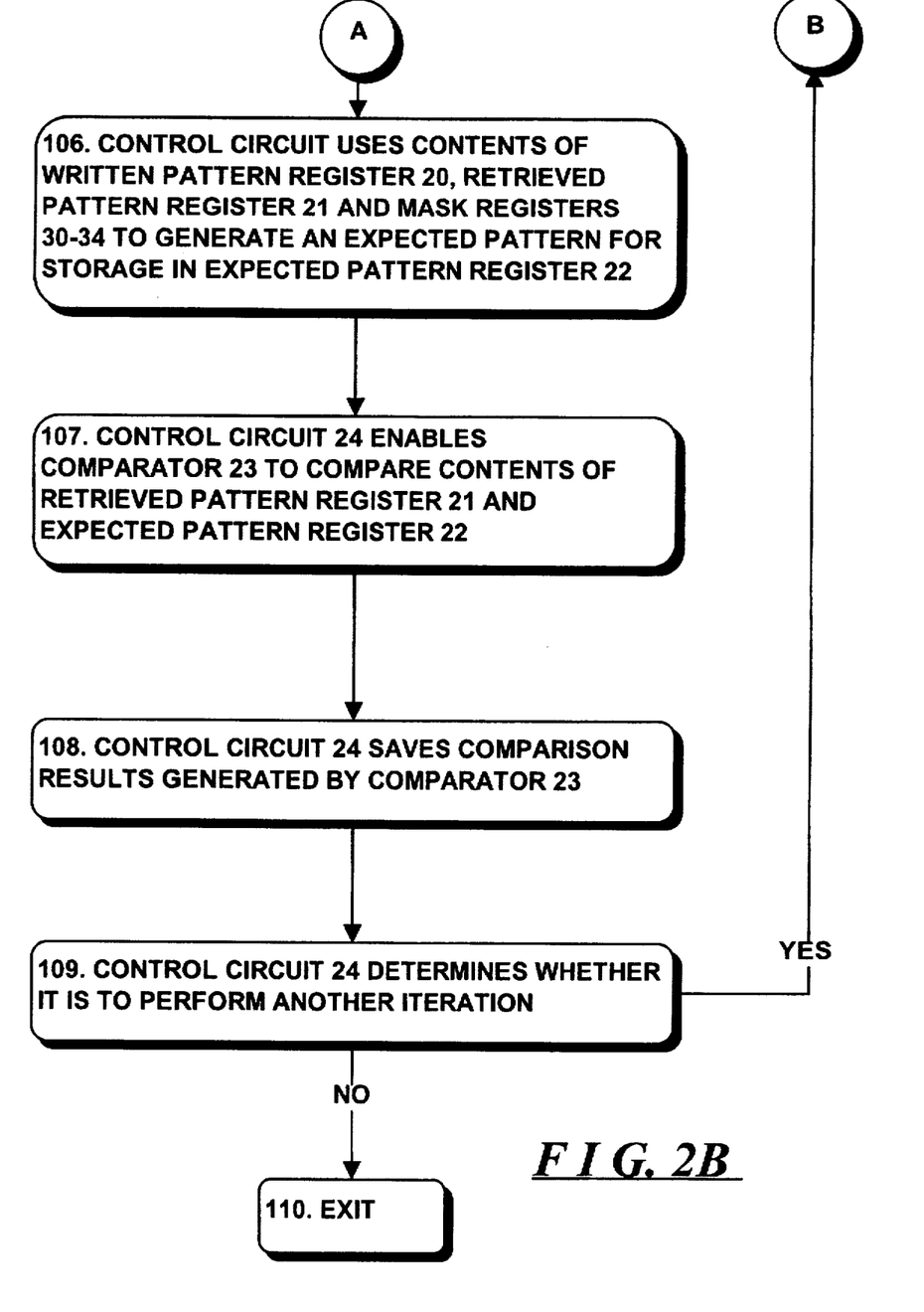

With this background, the operations performed by the system 10, under control of the control circuit 24, in testing register 11 will be described in connection with the flow chart depicted in FIG. 2. With reference to FIG. 2, when the control circuit 24 is enabled to test a register 11 (step 100), it will initially generate the masks for the mask registers 30 through 34 for the respective read/write, read-only, write-only, always-"0" and always-"1" categories (step 101). If the masks were previously generated, the control circuit 24 need only load the masks in the respective registers 30 through 34. On the other hand, if the masks were not previously generated, the control circuit 24 may generate the masks using the register bit definition table 35 and load them (the masks) in the respective registers 30 through 34.

In addition, the control circuit 24 will generate a data word comprising a pattern of bits for storage in the written pattern register 20 (step 102). As described above, during testing of the register 11, the control circuit 24 will, in a series of iterations, preferably test the register 11 using data words having a variety of bit patterns, and operations performed by the control circuit 24 in generating data words having various patterns to be used in testing register 11 will be described below. In each iteration, after a data word is generated (step 102), the control circuit 24 will enable the data word to be stored in the register 11 under test (step 103) and thereafter to be retrieved (step 104), and stored in the retrieved pattern register 21 (step 105).

After storing the retrieved data word in the retrieved pattern register 21 in step 105, the control circuit 24 will use the contents of the written pattern register 20 and retrieved pattern register 21, along with the contents of the mask registers 30 through 34, to generate an expected pattern for storage in the expected pattern register 22 as described above (step 106). After generating the expected pattern, the control circuit 24 can enable the comparator 23 to compare the contents of the retrieved pattern register 21 and the expected pattern register 22 (step 107). As described above, the comparator 23 will generate a REGISTER VER register verified indication if it determines that the contents of the retrieved pattern register 21 correspond to the contents of the expected pattern register 22, or an ERROR indication if it determines that the contents of the retrieved pattern register 21 do not correspond to the contents of the expected pattern register 22. The control circuit 24 may store selected information regarding the operations performed in steps 102 through 107 (step 108), such as the bit pattern of the data word generated in step 102 and the indication generated by the comparator 23 in step 107 for later use. In addition, the control circuit 24 will determine whether it is to preform another iteration (step 109) and if so will return to step 102 to generate another data word and repeat the operations as described above in connection with steps 102 through 108.

The control circuit may perform the operations described above in connection with steps 102 through 109 through a series of iterations, in each iteration testing the register 11 using a data word with a selected bit pattern. At some point, the control circuit 24 will determine in step 109 that it is not to perform another iteration and will exit (step 110).

As noted above, the control circuit 24 in step 102 generates a data word comprising a pattern of bits for use in testing register 11 under test during each iteration. The control circuit 24 may use a number of strategies in generating the data words for use in testing register 11. Illustrative strategies include, for example, (i) Generation of data words having random bit patterns. For this strategy, the control circuit 24 may use, for example, a random or pseudo-random number generator (not shown) to generate digital data words having random or pseudo-random binary-encoded value.

(ii) Generation of successive data words in which bit patterns are scanned across the data word. That is, if in the data word generated for one iteration a bit in written pattern bit storage location $20(n_s)$ is set (that is, the location stores the value "one") or clear (that is, the location stores the value "zero"), in the data word generated for the next iteration the bit in written pattern bit storage location $20(n_s+c)$, where "c" is a constant value, is similarly set or clear, for all of the storage locations. For example, in a first iteration a bit having the value "one" may be loaded into storage location 20(0), in the next iteration storage location 20(1) may receive a bit having the value "one," and so forth through successive iterations and storage locations 20(n) until the storage location 20(N) receives a bit having the value "one." In each of the successive iterations, bit(s) having the value "zero" may be loaded into storage location(s) which previously had bit(s) with the value "one." For this strategy, the written pattern register 20 may include a shift register and the control circuit 24 may store bit having a selected value in, for example, location 20(0), during an iteration, which will be shifted into locations 20(1), 20(2), and so forth, during successive iterations.

(iii) Generation of successive data words in which, for example, a counter (not shown) provides bits defining a series binary-encoded values, which may be stored in successive contiguous or non-contiguous written pattern bit storage locations $20(n_i) \ldots 20(n_U)$ of the written pattern register 21. This strategy may be advantageously used particularly to provide all or a significant subset of the possible bit patterns which may be used particularly for tested register bit storage locations 11(n) which are of the read/write category.

(iv) During one set of iterations, generating data words according to a selected strategy, and during another set of iterations (which may be interleaved with the previously-described set of iterations) generating words which are the complement of the data words generated during the previously-described set of iterations. For this strategy, the control circuit 24 may use inverters (not shown) for each of the storage locations 20(n) to provide the complement for the bit stored in the respective locations 20(n).

In addition, the control circuit 24 may use combinations of these and other strategies for generating the data words, and may use particular strategies in connection with bit storage locations which are in particular ones of the five categories described above. For example, as described above, the control circuit 24 may elect to use the counter strategy (strategy (iii)) described above in connection with tested register bit storage locations 11(n) which are of the read/write category, while using the random or scanning strategy (strategies (i) and (ii)) in connection with tested register bit storage locations 11(n) which are of other categories.

In addition, the control circuit 24 may use the complementation strategy (strategy (iv)) in connection with tested register bit storage locations 11(n) which are of the read-only category and compare data words which were retrieved during the two sets of iterations. If the control circuit 24 determines that the bit patterns of data words which were retrieved from the storage locations 11(n) in the read-only category during the two sets of iterations are the same, for a variety of bit patterns from data words written into the storage locations 11(n) in the read-only category, that would serve to verify that data bits written into the storage locations 11(n) in the read-only category has no effect on the data bits which are actually contained in the storage locations 11(n) in the read-only category.

The register test system 10 provides a number of advantages. In particular, it allows registers, such as register 11 under test, to be generally exhaustively tested using a number of data words which may be significantly fewer than the number of different data words which may be stored in a register. For example, in a register having thirty-two bit storage locations (that is, "N" equals thirty-one), the number of different data words which may be stored in the register 11 is $2^{32}$, that is, which would otherwise require four billion data words. By categorizing the storage locations in the register under test into a number of categories, and using data word generation strategies which may be related to the characteristics of the particular strategies, the system 10 may effectively exhaustively test the register using a number of different data words which may be significantly fewer than the number of different data word than may be stored in the register.

It will be appreciated numerous variations and modifications may be made to the register test system 10. For example, the system 10 may comprise a part of the digital electronic system whose register(s) are to be tested, and store data words in and retrieve data words from the register(s) to be tested over local connections in the digital electronic system. Alternatively, the register test system 10 may be located remote from the digital electronic system and communicate with the digital electronic system over, for example, a communications network or the public telephone system; in such an arrangement, the system 10 may transmit one or more data words to the digital electronic system over the communications network or public telephone system and enable the digital electronic system to store them (the data word(s)) in the register to be tested, retrieve the data word(s) from the register, and return the retrieved data word(s) to the system 10 over the communications network or public telephone system. After the register test system 10 receiving the retrieved data word(s), it may process the respective original and retrieved data words as described above to verify correct operation by the register under test.

Furthermore, it will be appreciated that the register test system 10 may be used to test and verify the operation of registers having any number "N" of bit storage locations.

It will be appreciated that a system in accordance with the invention can be constructed in whole or in part from special purpose hardware or a general purpose computer system, or any combination thereof, any portion of which may be controlled by a suitable program.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. A register test system for testing operational status of a register, the register test system comprising:

A. a written pattern generator for generating a written bit pattern and for storing the written bit pattern in the register;

B. a pattern retriever for, after the written pattern generator has stored the written bit pattern in the register, retrieving a bit pattern from the register;

C. an expected pattern generator for generating an expected bit pattern for the register, the expected bit pattern comprising a plurality of bits whose values are generated from a plurality of mask patterns each associated with one of a plurality of bit categories for the register, each register bit category being associated with a predetermined register bit characteristic;

D. a pattern comparator for comparing the retrieved bit pattern retrieved by the pattern retriever and the expected bit pattern generated by the expected pattern generator to assess operational status of the register.

2. A register test system as defined in claim 1 in which said expected pattern generator further generates said expected bit pattern from the written bit pattern generated by the written pattern generator.

·3. A register test system as defined in claim 2 in which one of said categories comprises a read/write category associated with a read/write bit pattern for said register, the expected pattern generator using a portion of the written bit pattern corresponding to the read/write bit pattern in generating the expected bit pattern for the read/write category.

4. A register test system as defined in claim 3 in which the register comprises a plurality of bit storage locations, the written bit pattern and expected bit pattern each comprise a plurality of bit positions, and the read/write bit pattern identifies the ones of the bit storage locations which are associated with the read/write category, the expected pattern generator generating the bit positions for the expected bit pattern corresponding to the bit storage locations associated with the read/write category as corresponding ones of the bit positions of the written bit pattern.

5. A register test system as defined in claim 1 in which said expected pattern generator further generates said expected bit pattern from the retrieved bit pattern retrieved by the pattern retriever.

6. A register test system as defined in claim 5 in which one of said categories comprises a read-only category associated with a read-only bit pattern for said register, the expected pattern generator using a portion of the retrieved bit pattern corresponding to the read-only bit pattern in generating the expected bit pattern for the read-only category.

7. A register test system as defined in claim 6 in which the register comprises a plurality of bit storage locations, the retrieved bit pattern and expected bit pattern each comprise a plurality of bit positions, and the read-only bit pattern identifies the ones of the bit storage locations which are associated with the read-only category, the expected pattern generator generating the bit positions for the expected bit pattern corresponding to the bit storage locations associated with the read-only category as corresponding ones of the bit positions of the retrieved bit pattern.

8. A register test system as defined in claim 1 in which one of said categories comprises a write-only category associated with a write-only bit pattern for said register, the expected pattern generator using a portion of the retrieved bit pattern corresponding to the write-only bit pattern in generating the expected bit pattern for the write-only category.

9. A register test system as defined in claim 8 in which the register comprises a plurality of bit storage locations, the retrieved bit pattern and expected bit pattern each comprise a plurality of bit positions, and the write-only bit pattern identifies the ones of the bit storage locations which are associated with the write-only category, the expected pattern generator generating the bit positions for the expected bit pattern corresponding to the bit storage locations associated with the write-only category as corresponding ones of the bit positions of the retrieved bit pattern.

10. A register test system as defined in claim 1 in which one of said categories comprises a predetermined-value category associated with a predetermined value bit pattern for said register, the expected pattern generator using a portion of the predetermined-value bit pattern in generating the expected bit pattern for the predetermined-value category.

11. A register test system as defined in claim 10 in which the register comprises a plurality of bit storage locations, and expected bit pattern comprises a plurality of bit positions, and the predetermined-value bit pattern identifies the ones of the bit storage locations which are associated with the predetermined value category, the expected pattern generator generating the bit positions for the expected bit pattern corresponding to the bit storage locations associated with the predetermined value category as corresponding ones of the bit positions of the predetermined-value bit pattern.

12. A register test system as defined in claim 1 in which one of said categories comprises a predetermined-value category associated with a predetermined value bit pattern for said register, the expected pattern generator using a portion of the complement of the predetermined-value bit pattern in generating the expected bit pattern for the predetermined-value category.

13. A register test system as defined in claim 12 in which the register comprises a plurality of bit storage locations, and expected bit pattern comprises a plurality of bit positions, and the predetermined-value bit pattern identifies the ones of the bit storage locations which are associated with the predetermined value category, the expected pattern generator generating the bit positions for the expected bit pattern corresponding to the bit storage locations associated with the predetermined value category as complements of corresponding ones of the bit positions of the predetermined-value bit pattern.

14. A register test system as defined in claim 1 further comprising a mask pattern generator for using register bit category information to generate said mask patterns.

15. A register test system as defined in claim 1 in which said written pattern generator, said pattern retriever, said expected pattern generator and said pattern comparator operate in a series of iterations, the pattern comparator assessing the operational status of the register from the comparisons in the respective iterations.

16. A register test system as defined in claim 15 in which said written pattern generator generates a distinct written bit pattern for each successive iteration.

17. A register test system as defined in claim 16 in which the written pattern generator generates the written bit pattern for successive iterations as a random bit pattern.

18. A register test system as defined in claim 16 in which the written bit pattern comprises a series of bits, and in which written pattern generator generates the written bit pattern in successive iterations by shifting a bit pattern through at least a portion of the series of bits.

19. A register test system as defined in claim 16 in which at least a portion of written bit pattern comprises a series of bits from a least significant bit to a most significant bit, the written pattern generator generating the written bit pattern in successive iterations for said portion representing successive binary-encoded numerical values.

20. A register test system as defined in claim 16 in which, for at least one iteration, the written pattern generator generates the written bit pattern as the complement of the written bit pattern for the previous iteration.

21. A register test method for testing operational status of a register, the register test method comprising the steps of:

A. generating a written bit pattern and for storing the written bit pattern in the register;

B. after the written pattern generator has stored the written bit pattern in the register, retrieving a bit pattern from the register;

C. for generating an expected bit pattern for the register, the expected bit pattern comprising a plurality of bits whose values are generated from a plurality of mask patterns each associated with one of a plurality of bit categories for the register, each register bit category being associated with a predetermined register bit characteristic;

D. comparing the retrieved bit pattern retrieved by the pattern retriever and the expected bit pattern generated by the expected pattern generator to assess operational status of the register.

22. A register test method as defined in claim 11 in which said expected pattern generating step includes the step of generating said expected bit pattern from the written bit pattern generated during the written pattern generating step.

23. A register test method as defined in claim 12 in which one of said categories comprises a read/write category associated with a read/write bit pattern for said register, the expected pattern generating step including the step of using a portion of the written bit pattern corresponding to the read/write bit pattern in generating the expected bit pattern for the read/write category.

24. A register test method as defined in claim 13 in which the register comprises a plurality of bit storage locations, the written bit pattern and expected bit pattern each comprise a plurality of bit positions, and the read/write bit pattern identifies the ones of the bit storage locations which are associated with the read/write category, the expected pattern generating step including the step of generating the bit positions for the expected bit pattern corresponding to the bit storage locations associated with the read/write category as corresponding ones of the bit positions of the written bit pattern.

25. A register test method as defined in claim 11 in which said expected pattern generating step includes the step of generating said expected bit pattern from the retrieved bit pattern retrieved during the pattern retrieving step.

26. A register test method as defined in claim 15 in which one of said categories comprises a read-only category associated with a read-only bit pattern for said register, the expected pattern generating step including the step of using a portion of the retrieved bit pattern corresponding to the read-only bit pattern in generating the expected bit pattern for the read-only category.

27. A register test method as defined in claim 16 in which the register comprises a plurality of bit storage locations, the retrieved bit pattern and expected bit pattern each comprise a plurality of bit positions, and the read-only bit pattern identifies the ones of the bit storage locations which are associated with the read-only category, the expected pattern generating step including the step of generating the bit positions for the expected bit pattern corresponding to the bit storage locations associated with the read-only category as corresponding ones of the bit positions of the retrieved bit pattern.

28. A register test method as defined in claim 11 in which one of said categories comprises a write-only category associated with a write-only bit pattern for said register, the expected pattern generating step including the step of using a portion of the retrieved bit pattern corresponding to the write-only bit pattern in generating the expected bit pattern for the write-only category.

29. A register test method as defined in claim 18 in which the register comprises a plurality of bit storage locations, the retrieved bit pattern and expected bit pattern each comprise a plurality of bit positions, and the write-only bit pattern identifies the ones of the bit storage locations which are associated with the write-only category, the expected pattern generating step including the step of generating the bit positions for the expected bit pattern corresponding to the bit storage locations associated with the write-only category as corresponding ones of the bit positions of the retrieved bit pattern.

30. A register test method as defined in claim 21 in which one of said categories comprises a predetermined-value category associated with a predetermined value bit pattern for said register, the expected pattern generating step including the step of using a portion of the predetermined-value bit pattern in generating the expected bit pattern for the predetermined-value category.

31. A register test method as defined in claim 30 in which the register comprises a plurality of bit storage locations, and expected bit pattern comprises a plurality of bit positions, and the predetermined-value bit pattern identifies the ones of the bit storage locations which are associated with the predetermined value category, the expected pattern generating step including the step of generating the bit positions for the expected bit pattern corresponding to the bit storage locations associated with the predetermined value category as corresponding ones of the bit positions of the predetermined-value bit pattern.

32. A register test method as defined in claim 31 in which one of said categories comprises a predetermined-value category associated with a predetermined value bit pattern for said register, the expected pattern generating step including the step of using a portion of the complement of the predetermined-value bit pattern in generating the expected bit pattern for the predetermined-value category.

33. A register test method as defined in claim 32 in which the register comprises a plurality of bit storage locations, and expected bit pattern comprises a plurality of bit positions, and the predetermined-value bit pattern identifies the ones of the bit storage locations which are associated with the predetermined value category, the expected pattern generating step including the step of generating the bit positions for the expected bit pattern corresponding to the bit storage locations associated with the predetermined value category as complements of corresponding ones of the bit positions of the predetermined-value bit pattern.

34. A register test method as defined in claim 31 further comprising a mask pattern generating step for using register bit category information to generate said mask patterns.

35. A register test method as defined in claim 31 in which said written pattern generating step, said pattern retrieving step, said expected pattern generating step and said pattern comparing step are performed in a series of iterations, the operational status of the register being assessed from the comparisons in the respective iterations.

36. A register test method as defined in claim 35 in which said written pattern generating step includes the step of generating a distinct written bit pattern for each successive iteration.

37. A register test method as defined in claim 36 in which the written pattern generating step includes the step of generating the written bit pattern for successive iterations as a random bit pattern.

38. A register test method as defined in claim 36 in which the written bit pattern comprises a series of bits, and in which written pattern generating step includes the step of generating the written bit pattern in successive iterations by shifting a bit pattern through at least a portion of the series of bits.

39. A register test method as defined in claim 36 in which at least a portion of written bit pattern comprises a series of bits from a least significant bit to a most significant bit, the written pattern generating step including the step of generating the written bit pattern in successive iterations for said portion representing successive binary-encoded numerical values.

40. A register test method as defined in claim 36 in which, for at least one iteration, the written pattern generating step includes the step of generating the written bit pattern as the complement of the written bit pattern for the previous iteration.

41. A register test computer program product for use in connection with a program-controlled device for testing operational status of a register, the register test computer program product comprising a medium readable by said program-controlled device, said medium having thereon:

A. a written pattern generator code module for enabling the program-controlled device to generate a written bit pattern and for storing the written bit pattern in the register;

B. a pattern retriever code module for, after the written bit pattern has been stored in the register, enabling the program-controlled device to retrieve a bit pattern from the register;

C. an expected pattern generator code module for enabling the program-controlled device to generate an expected bit pattern for the register, the expected bit pattern comprising a plurality of bits whose values are generated from a plurality of mask patterns each associated with one of a plurality of bit categories for the register, each register bit category being associated with a predetermined register bit characteristic;

D. a pattern comparator code module for enabling the program-controlled device to compare the retrieved bit pattern and the expected bit pattern to assess operational status of the register.

42. A register test computer program product as defined in claim 41 in which said expected pattern generator code module further enables said program-controlled device to generate said expected bit pattern from the written bit pattern.

43. A register test computer program product as defined in claim 42 in which one of said categories comprises a read/write category associated with a read/write bit pattern for said register, the expected pattern generator code module enabling said program-controlled device to use a portion of the written bit pattern corresponding to the read/write bit pattern in generating the expected bit pattern for the read/write category.

44. A register test computer program product as defined in claim 43 in which the register comprises a plurality of bit storage locations, the written bit pattern and expected bit pattern each comprise a plurality of bit positions, and the read/write bit pattern identifies the ones of the bit storage locations which are associated with the read/write category, the expected pattern generator code module enabling said program-controlled device to generate the bit positions for the expected bit pattern corresponding to the bit storage locations associated with the read/write category as corresponding ones of the bit positions of the written bit pattern.

45. A register test computer program product as defined in claim 41 in which said expected pattern generator code module further enables said program-controlled device to generate said expected bit pattern from the retrieved bit pattern.

46. A register test computer program product as defined in claim 45 in which one of said categories comprises a read-only category associated with a read-only bit pattern for said register, the expected pattern generator code module enabling said program-controlled device to use a portion of the retrieved bit pattern corresponding to the read-only bit pattern in generating the expected bit pattern for the read-only category.

47. A register test computer program product as defined in claim 46 in which the register comprises a plurality of bit storage locations, the retrieved bit pattern and expected bit pattern each comprise a plurality of bit positions, and the read-only bit pattern identifies the ones of the bit storage locations which are associated with the read-only category, the expected pattern generator code module enabling the program-controlled device to generate the bit positions for the expected bit pattern corresponding to the bit storage locations associated with the read-only category as corresponding ones of the bit positions of the retrieved bit pattern.

48. A register test computer program product as defined in claim 41 in which one of said categories comprises a write-only category associated with a write-only bit pattern for said register, the expected pattern generator code module enabling said program-controlled device to use a portion of the retrieved bit pattern corresponding to the write-only bit pattern in generating the expected bit pattern for the write-only category.

49. A register test computer program product as defined in claim 48 in which the register comprises a plurality of bit storage locations, the retrieved bit pattern and expected bit pattern each comprise a plurality of bit positions, and the write-only bit pattern identifies the ones of the bit storage locations which are associated with the write-only category, the expected pattern generator code module enabling said computer to generate the bit positions for the expected bit pattern corresponding to the bit storage locations associated with the write-only category as corresponding ones of the bit positions of the retrieved bit pattern.

50. A register test computer program product as defined in claim 41 in which one of said categories comprises a predetermined-value category associated with a predetermined value bit pattern for said register, the expected pattern generator code module enabling said program-controlled device to use a portion of the predetermined-value bit pattern in generating the expected bit pattern for the predetermined-value category.

51. A register test computer program product as defined in claim 50 in which the register comprises a plurality of bit storage locations, and expected bit pattern comprises a plurality of bit positions, and the predetermined-value bit pattern identifies the ones of the bit storage locations which are associated with the predetermined value category, the expected pattern generator code module enabling said program-controlled device to generate the bit positions for the expected bit pattern corresponding to the bit storage locations associated with the predetermined value category as corresponding ones of the bit positions of the predetermined-value bit pattern.

52. A register test computer program product as defined in claim 41 in which one of said categories comprises a predetermined-value category associated with a predetermined value bit pattern for said register, the expected pattern generator code module enabling said program-controlled device to use a portion of the complement of the predetermined-value bit pattern in generating the expected bit pattern for the predetermined-value category.

53. A register test computer program product as defined in claim 52 in which the register comprises a plurality of bit storage locations, and expected bit pattern comprises a plurality of bit positions, and the predetermined-value bit pattern identifies the ones of the bit storage locations which are associated with the predetermined value category, the expected pattern generator code module enabling said program-controlled device to generate the bit positions for the expected bit pattern corresponding to the bit storage locations associated with the predetermined value category as complements of corresponding ones of the bit positions of the predetermined-value bit pattern.

54. A register test computer program product as defined in claim 41 further comprising a mask pattern generator code module for enabling said program-controlled device to use register bit category information to generate said mask patterns.

55. A register test computer program product as defined in claim 41 in which said pattern generator code module, said pattern retriever code module, said expected pattern generator code module and said pattern comparator code module enable said program-controlled device to operate in a series of iterations to enable the the operational status of the register to be assessed from the comparisons in the respective iterations.

56. A register test computer program product as defined in claim 55 in which said written pattern generator code module enables said program-controlled device to generate a distinct written bit pattern for each successive iteration.

57. A register test computer program product as defined in claim 56 in which the written pattern generator code module enables said program-controlled device to generate the written bit pattern for successive iterations as a random bit pattern.

58. A register test computer program product as defined in claim 56 in which the written bit pattern comprises a series of bits, and in which written pattern generator code module enables said program-controlled device to generate the written bit pattern in successive iterations by shifting a bit pattern through at least a portion of the series of bits.

59. A register test computer program product as defined in claim 56 in which at least a portion of written bit pattern comprises a series of bits from a least significant bit to a most significant bit, the written pattern generator code module enabling said program-controlled device to generate the written bit pattern in successive iterations for said portion representing successive binary-encoded numerical values.

60. A register test computer program product as defined in claim 56 in which, for at least one iteration, the written pattern generator code module enabling said program-controlled device to generate the written bit pattern as the complement of the written bit pattern for the previous iteration.

* * * * *